United States Patent
Yokota et al.

(10) Patent No.: US 9,595,444 B2
(45) Date of Patent: Mar. 14, 2017

(54) FLOATING GATE SEPARATION IN NAND FLASH MEMORY

(71) Applicant: SanDisk Technologies Inc., Plano, TX (US)

(72) Inventors: Toshiya Yokota, Yokkaichi (JP); Atsushi Shimoda, Yokkaichi (JP); Takuya Sakurai, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/712,349

(22) Filed: May 14, 2015

(65) Prior Publication Data

US 2016/0336182 A1   Nov. 17, 2016

(51) Int. Cl.
| | |
|---|---|
| H01L 29/788 | (2006.01) |
| H01L 21/28 | (2006.01) |
| H01L 29/66 | (2006.01) |
| H01L 29/40 | (2006.01) |
| H01L 29/423 | (2006.01) |
| H01L 27/115 | (2006.01) |
| H01L 27/105 | (2006.01) |

(52) U.S. Cl.
CPC .... *H01L 21/28273* (2013.01); *H01L 27/1052* (2013.01); *H01L 27/11524* (2013.01); *H01L 29/401* (2013.01); *H01L 29/42324* (2013.01); *H01L 29/66825* (2013.01); *H01L 29/788* (2013.01)

(58) Field of Classification Search
CPC ................................................. H01L 21/28273
See application file for complete search history.

(56) References Cited

U.S. PATENT DOCUMENTS

| | | |
|---|---|---|
| 5,570,315 A | 10/1996 | Tanaka et al. |
| 5,768,192 A | 6/1998 | Eitan |
| 5,774,397 A | 6/1998 | Endoh et al. |
| 5,887,145 A | 3/1999 | Harari et al. |
| 6,011,725 A | 1/2000 | Eitan |
| 6,046,935 A | 4/2000 | Takeuchi et al. |
| 6,429,123 B1 | 8/2002 | Tseng |
| 6,432,780 B2 * | 8/2002 | Chen ................. 257/E21.143 |
| 6,894,341 B2 | 5/2005 | Sugimae et al. |
| 7,291,560 B2 | 11/2007 | Parascandola et al. |
| 7,495,294 B2 | 2/2009 | Higashitani |
| 7,951,669 B2 | 5/2011 | Harari et al. |

(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — Kimberly Rizkallah
*Assistant Examiner* — Mounir Amer
(74) *Attorney, Agent, or Firm* — Foley & Lardner LLP

(57) ABSTRACT

A method of forming a NAND flash memory includes anisotropically etching trenches of a gate stack down to an intermediate level in a floating gate polysilicon layer, leaving remaining portions of the floating gate polysilicon over the gate dielectric layer. Subsequently, forming a protective layer along exposed sides of the trenches. Then, electrically separating individual floating gates by a selective process that is directed to the remaining portions of the floating gate polysilicon layer exposed by trenches.

10 Claims, 8 Drawing Sheets

(56) References Cited

U.S. PATENT DOCUMENTS

| | | |
|---|---|---|
| 7,985,682 B2 | 7/2011 | Matsuzaki |
| 8,158,333 B2 | 4/2012 | Hashimoto |
| 8,194,470 B2 | 6/2012 | Higashitani |
| 8,227,354 B2 | 7/2012 | Kim et al. |
| 8,557,704 B2 | 10/2013 | Wells et al. |
| 2006/0216938 A1 | 9/2006 | Miyagawa et al. |
| 2006/0234166 A1 | 10/2006 | Lee et al. |
| 2007/0026684 A1 | 2/2007 | Parascandola et al. |
| 2007/0040228 A1* | 2/2007 | Kim .............. H01L 21/28061 257/412 |
| 2007/0105296 A1* | 5/2007 | Yokoi .............. H01L 21/28052 438/197 |
| 2008/0131793 A1 | 6/2008 | Lee et al. |
| 2008/0160747 A1* | 7/2008 | Kim .............. H01L 21/28247 438/593 |
| 2009/0051008 A1* | 2/2009 | Shin .............. H01L 27/0629 257/536 |
| 2009/0068829 A1* | 3/2009 | Lee .............. H01L 21/32137 438/594 |
| 2010/0120247 A1 | 5/2010 | Park |
| 2010/0155813 A1 | 6/2010 | Murata et al. |
| 2010/0173492 A1 | 7/2010 | Kim et al. |
| 2010/0308395 A1* | 12/2010 | Leem .............. H01L 27/11521 257/316 |
| 2011/0104899 A1 | 5/2011 | Lam et al. |
| 2012/0085733 A1 | 4/2012 | Mebarki et al. |
| 2012/0168841 A1 | 7/2012 | Chen et al. |
| 2012/0208361 A1 | 8/2012 | Ha |
| 2013/0065397 A1 | 3/2013 | Chen |
| 2014/0080299 A1 | 3/2014 | Sel et al. |

OTHER PUBLICATIONS

Chen et al., "Self-Aligned Triple Patterning to Extend Optical Lithography for 1x Patterning," International Symposium on Lithography Extensions, Oct. 21, 2010, 20 pages.

* cited by examiner

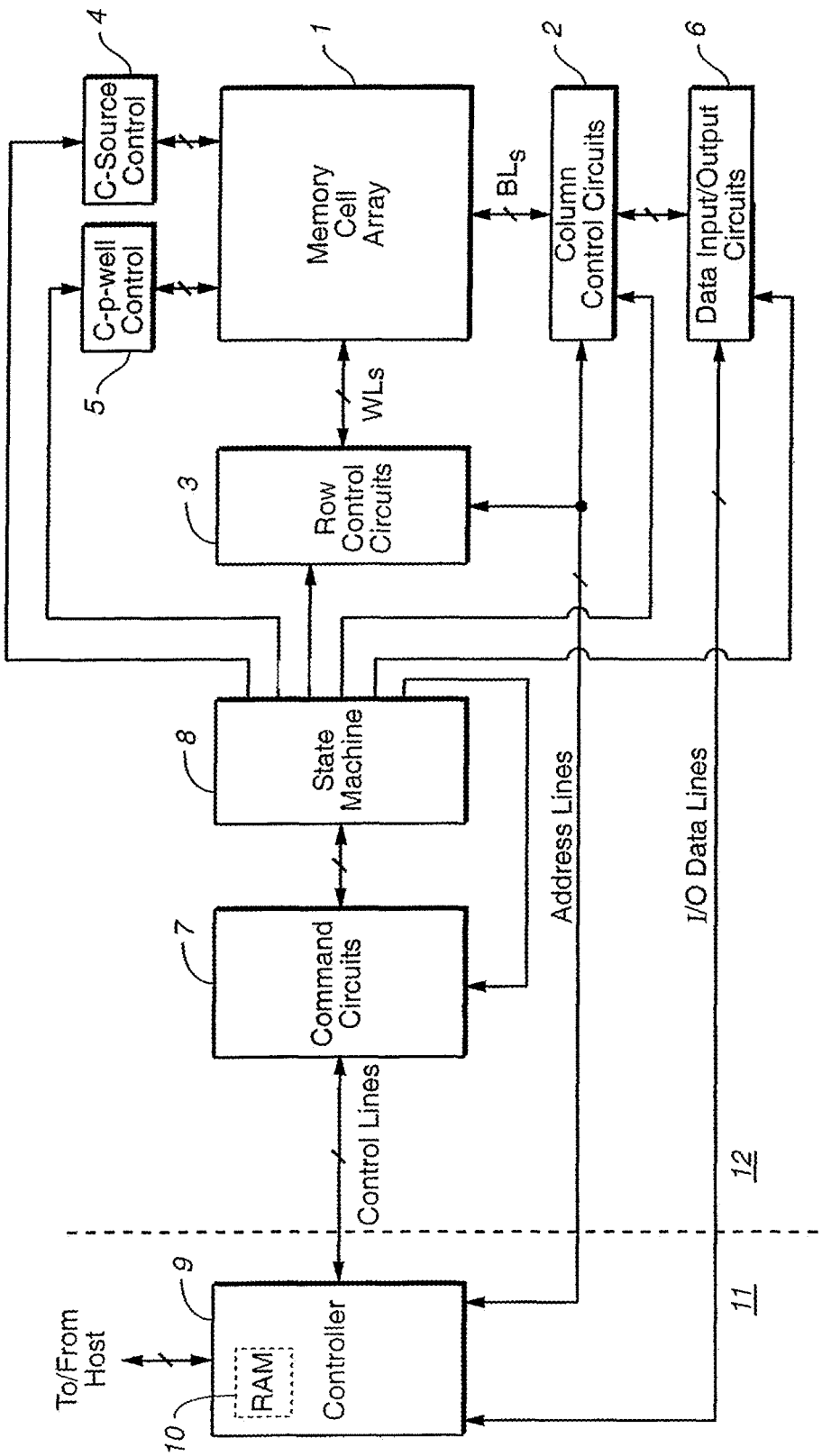
FIG._1 (Prior Art)

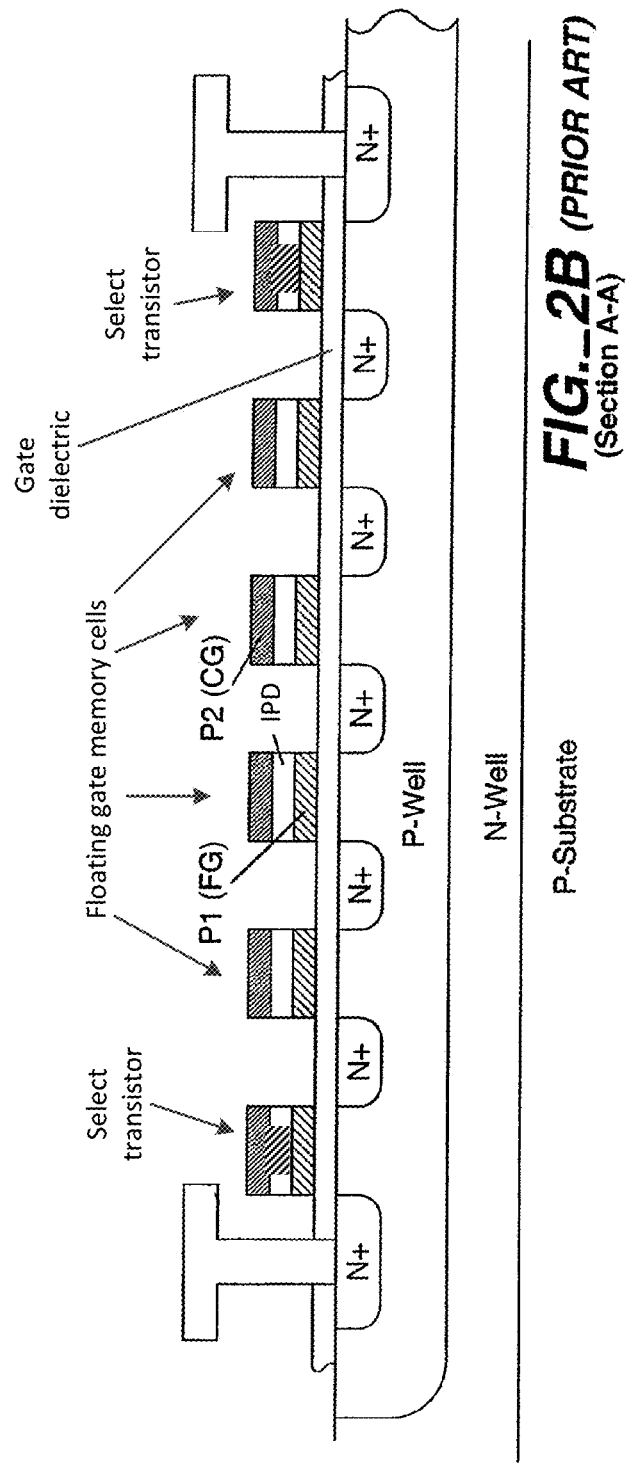
FIG._2B *(PRIOR ART)*
(Section A-A)

US 9,595,444 B2

FLOATING GATE SEPARATION IN NAND FLASH MEMORY

BACKGROUND

This specification relates generally to non-volatile semiconductor memories of the flash memory type, their formation, structure and use.

There are many commercially successful non-volatile memory products being used today, particularly in the form of small form factor cards, USB drives, embedded memory, and Solid State Drives (SSDs) which use an array of flash EEPROM cells. An example of a flash memory system is shown in FIG. 1, in which a memory cell array 1 is formed on a memory chip 12, along with various peripheral circuits such as column control circuits 2, row control circuits 3, data input/output circuits 6, etc.

One popular flash EEPROM architecture utilizes a NAND array, wherein a large number of strings of memory cells are connected through one or more select transistors between individual bit lines and a reference potential. A portion of such an array is shown in plan view in FIG. 2A. Although four floating gate memory cells are shown in each string, the individual strings typically include 16, 32 or more memory cell charge storage elements, such as floating gates, in a column. Control gate (word) lines labeled WL0-WL3 and string selection lines, Drain Select Line, "DSL" and Source Select Line "SSL" extend across multiple strings over rows of floating gates. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel.

The top and bottom of the string connect to the bit line and a common source line respectively through select transistors (source select transistor and drain select transistor). Select transistors do not contain floating gates and are used to connect NAND strings to control circuits when they are to be accessed, and to isolate them when they are not being accessed.

NAND memory arrays may be fabricated by forming a stack of layers that are then etched together so that the resulting structures are self-aligned. For example, word lines and underlying floating gates may be etched together using anisotropic etching with the same hard mask pattern so that word lines and floating gates are self-aligned. In general, it is desirable to etch such a stack in a manner that avoids under-etching or over-etching.

SUMMARY

According to an example of formation of a NAND flash memory array, a gate stack that includes floating gate polysilicon, inter-poly dielectric, and control gate polysilicon, is initially partially etched by anisotropic etching so that trenches extend part-way through the floating gate polysilicon layer. Remaining portions of floating gate polysilicon separate the trenches from the gate dielectric layer. A protective layer is then deposited along surfaces of the trenches and removed from the bottom surface so that floating gate polysilicon is exposed only at the bottoms of the trenches where thin portions of polysilicon remain on the gate dielectric. These portions of polysilicon are then subject to a selective process to electrically separate floating gates of different rows. A selective process may be a selective etch such as a wet etch or may be a Chemical Dry Etch (CDE) process. Another example of a selective process is a selective oxidation process that forms silicon oxide from remaining polysilicon and thus replaces electrically-conductive polysilicon with electrically-insulating silicon oxide. Floating gate polysilicon may consist of multiple layers of polysilicon with different characteristics to facilitate control of trench formation (e.g. depth control and uniformity). A lower polysilicon layer may be doped (e.g. heavily boron or carbon doped) to act as an etch-stop layer and/or to provide end-point detection.

An example of a method of forming a NAND flash memory includes: forming a gate dielectric layer on a substrate; forming a floating gate polysilicon layer on the gate dielectric layer; forming additional layers over the floating gate polysilicon layer; forming an etch mask over the additional layers; performing anisotropic etching with the etch mask in place to etch trenches down to an intermediate level in the floating gate polysilicon layer, the trenches stopping while portions of the floating gate polysilicon remain between the trenches and the gate dielectric layer; subsequently forming a protective layer along exposed sides of the trenches; and subsequently electrically separating individual floating gates by a selective process that is directed to the remaining portions of the floating gate polysilicon layer exposed by trenches.

Forming the floating gate polysilicon layer may include forming a doped polysilicon layer on the gate dielectric layer and subsequently forming an undoped polysilicon layer on an upper surface of the doped polysilicon layer. The intermediate level may be at or near the upper surface of the doped polysilicon layer. The anisotropic etching may have a significantly higher etch rate for the undoped polysilicon than for the doped polysilicon so that the doped polysilicon layer acts as an etch stop layer. The anisotropic etching may be stopped in response to detection of a level of dopant in etch byproducts that exceeds a predetermined limit during anisotropic etching. The protective layer may be formed by depositing the protective layer along all exposed surfaces and subsequently removing the protective layer from bottoms of trenches to expose the remaining portions of the floating gate polysilicon layer. The selective process may be a selective etch that has a substantially higher etch rate for polysilicon than for gate dielectric material or protective layer material. The selective etch may be a wet etch using fluonitric acid. The selective process may be a selective oxidation process that oxidizes exposed polysilicon and does not substantially oxidize the protective layer. The selective oxidation process may oxidize the floating gate polysilicon under the trenches down to the gate dielectric and may not substantially oxidize the gate dielectric. The selective process may be a Chemical Dry Etch (CDE) process.

An example of a method of forming a NAND flash memory includes: forming a gate dielectric layer on a substrate; forming a doped floating gate polysilicon layer on an upper surface of the gate dielectric layer; forming an undoped floating gate polysilicon layer on an upper surface of the doped floating gate polysilicon layer; forming additional layers over the undoped floating gate polysilicon layer; forming an etch mask over the additional layers; performing anisotropic etching with the etch mask in place to etch trenches down through the undoped floating gate polysilicon layer, stopping the anisotropic etching at or near the upper surface of the doped floating gate polysilicon layer while portions of the doped floating gate polysilicon remain between the trenches and the gate dielectric layer; subsequently forming a protective layer along exposed sides of the trenches; and subsequently selectively removing the portions of the doped floating gate polysilicon from over the gate dielectric layer using an etch that etches doped polysilicon at substantially faster rate than the gate dielectric layer or the protective layer.

The protective layer and the gate dielectric layer may be formed of silicon oxide. The portions of the doped floating gate polysilicon may be selectively removed by wet etching with fluonitric acid. The portions of the doped floating gate polysilicon may be selectively removed by Chemical Dry Etching (CDE). The doped floating gate polysilicon layer may be doped with boron (B) or carbon (C).

An example of a NAND flash memory array includes: a gate dielectric layer; a plurality of floating gates, each of the plurality of floating gates consisting of a lower portion formed of doped polysilicon lying on the gate dielectric layer and an upper portion formed of undoped polysilicon lying on an upper surface of the lower portion; a plurality of trenches separating the plurality of floating gates, the plurality of trenches extending to the gate dielectric layer; and a plurality of sidewalls along sides of upper portions of floating gates, the plurality of sidewalls having lower edges that are approximately level with the upper surface of the lower portion.

The gate dielectric layer and the plurality of sidewalls may be formed of silicon dioxide. Portions of silicon oxide may overlie the gate dielectric layer in the plurality of trenches. The plurality of sidewalls may extend along sides of word lines that extend over the upper portions.

Various aspects, advantages, features and embodiments are included in the following description of examples, which description should be taken in conjunction with the accompanying drawings.

BRIEF DESCRIPTION OF THE DRAWINGS

FIG. 1 is a block diagram of a prior art memory system.

FIG. 2B shows a cross section of the NAND array of FIG. 2A.

DETAILED DESCRIPTION OF EXEMPLARY EMBODIMENTS

Memory System

Figure 2A:
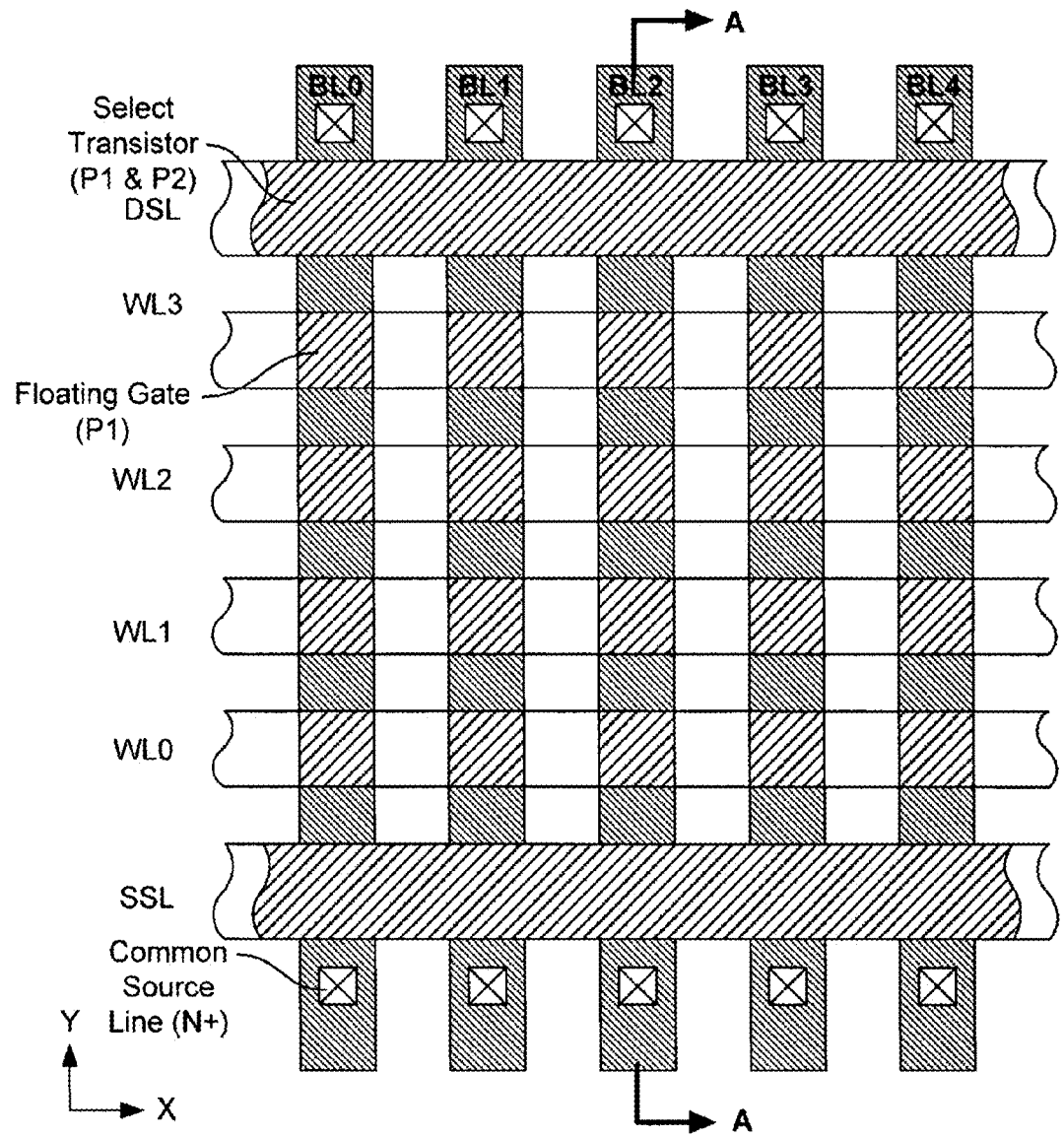
FIG. 2A is a plan view of a prior art NAND array.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

Examples of memory arrays are not limited to the two dimensional and three dimensional exemplary structures described here and may include various arrangements of memory cells using various physical phenomena to store data.

An example of a prior art memory system, which may be formed using various techniques described here, is illustrated by the block diagram of FIG. 1. A planar memory cell array 1 including a plurality of memory cells is controlled by a column control circuit 2, a row control circuit 3, a c-source control circuit 4 and a c-p-well control circuit 5. The memory cell array 1 is, in this example, of the NAND type similar to that described above. A control circuit 2 is connected to bit lines (BL) of the memory cell array 1 for reading data stored in the memory cells, for determining a state of the memory cells during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells are formed. The c-source control circuit 4 controls a common source line (labeled as "c-source" in FIG. 1) connected to the memory cells (M). The c-p-well control circuit 5 controls the c-p-well voltage.

The data stored in the memory cells are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 9. The controller 9 includes various types of registers and other memory including a volatile random-access-memory (RAM) 10.

The memory system of FIG. 1 may be embedded as part of the host system, or may be included in a memory card, USB drive, or similar unit that is removably insertible into a mating socket of a host system. Such a card may include the entire memory system, or the controller and memory array, with associated peripheral circuits, may be provided in separate cards. The memory system of FIG. 1 may also be used in a Solid State Drive (SSD) or similar unit that provides mass data storage in a tablet, laptop computer, or similar device. Memory systems may be used with a variety of hosts in a variety of different environments. For example, a host may be a mobile device such as a cell phone, laptop, music player (e.g. MP3 player), Global Positioning System (GPS) device, tablet computer, or the like. Such memory systems may be inactive, without power, for long periods during which they may be subject to various conditions including high temperatures, vibration, electromagnetic fields, etc. Memory systems for such hosts, whether removable or embedded, may be selected for low power consumption, high data retention, and reliability in a wide range of environmental conditions (e.g. a wide temperature range). Other hosts may be stationary. For example, servers used for internet applications may use nonvolatile memory systems for storage of data that is sent and received over the internet. Such systems may remain powered up without interruption for extended periods (e.g. a year or more) and may be frequently accessed throughout such periods. Individual blocks may be frequently written and erased so that endurance may be a major concern.

FIGS. 2A-2B show different views of a prior art NAND flash memory. In particular, FIG. 2A shows a plan view of a portion of such a memory array including bit lines and word lines (this is a simplified structure with a small number of word lines and bit lines). FIG. 2B shows a cross section along A-A (along a NAND string) showing individual floating gate memory cells that are connected in series. Contacts, or vias, are formed at either end to connect the NAND strings in the memory array to conductive lines (e.g. connecting to bit lines at one end and to a common source line at the other end).

An individual floating gate memory cell is formed where a floating gate "FG" overlies a channel region in the substrate, with a gate dielectric separating the floating gate from the substrate. An Inter-Poly Dielectric ("IPD") layer overlies the floating gate and separates the floating gate from a control gate ("CG"). In the example of FIG. 2B, the floating gates are formed of a first polysilicon layer ("P1") and the control gates are formed of a second polysilicon layer ("P2"). Additional layers may also be provided. For example, a control gate may include a metal layer over a polysilicon layer. Generally, a stack of layers such as the layers shown (P1, IPD, P2) may be deposited as blanket layers in sequence and subsequently etched together to form self-aligned structures. Specifically, control gates and floating gates are self-aligned because they are formed using the same pattern. Memory cells of a NAND string are electrically connected together in series by implanted areas ("N+" in FIG. 2B) that act as source/drain regions of neighboring cells. Implantation may be performed after formation of floating gates and control gates so that the patterned stack acts as an implant mask and implantation is self-aligned with floating gates and control gates.

Figure 3:
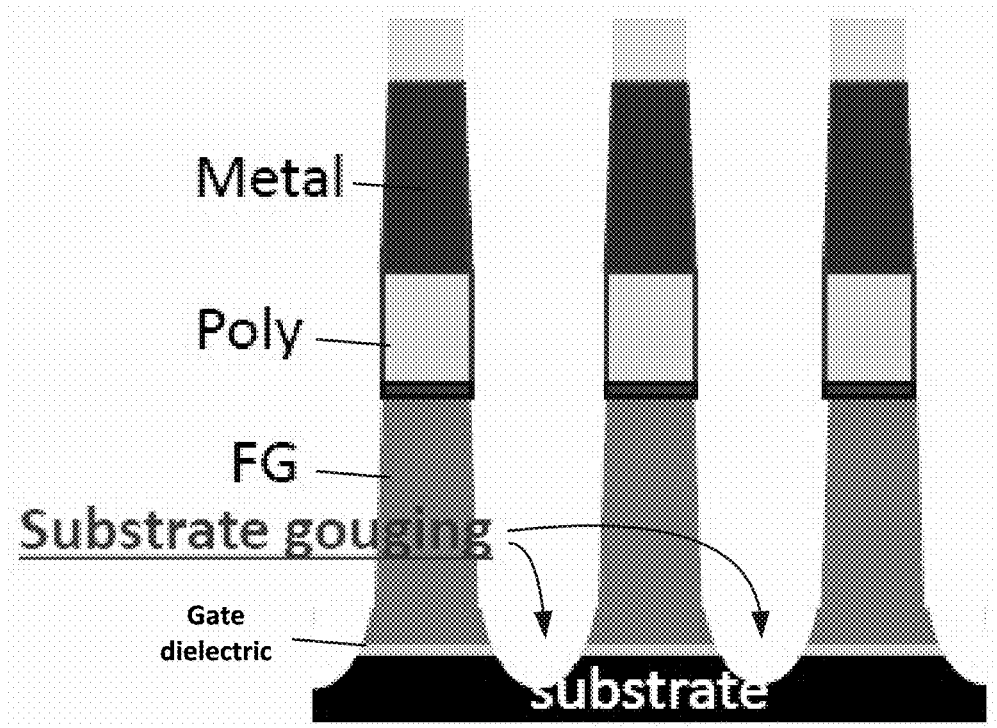
FIG. 3 illustrates over-etching resulting in substrate gouging.

Etching a stack of layers to form self-aligned floating gate memory cells presents certain challenges. FIG. 3 illustrates a problem where over-etching results in "substrate gouging" at locations between floating gates. In this example, etching continues down below the level of the bottom of the floating gate polysilicon ("FG"), below the level of the gate dielectric layer, and into the substrate. This causes areas of the substrate between floating gates to suffer etch damage, e.g. becoming gouged (eroded away). Such gouging, or other damage, may affect the electrical characteristics of memory cells, for example, by providing increased resistance along NAND strings, causing cells to become unreliable, and may therefore be undesirable. For example, if electrical characteristics are not within acceptable limits then the memory, or a portion of the memory, may be considered defective.

Figure 4:
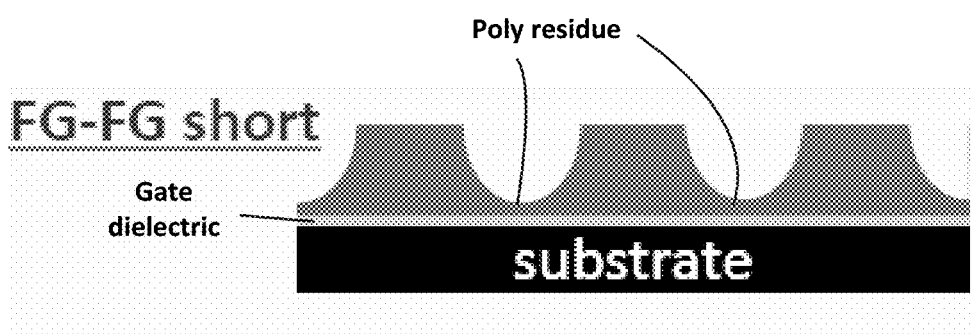
FIG. 4 illustrates under-etching resulting in floating gate-to-floating gate shorting.

FIG. 4 illustrates another example related to etching of a stack of layers to form self-aligned floating gate memory cells (FIG. 4 shows only the relevant area near the substrate, omitting upper structure of FIG. 3). In this case, under-etching results in some floating gate polysilicon remaining under the etched trenches. Thus, instead of extending down to the gate dielectric (as shown in FIG. 2B) or into the substrate (as shown in FIG. 3), in this example, etching stops before reaching the gate dielectric so that some polysilicon ("Poly residue") extends between neighboring floating gates. Because floating gate polysilicon is electrically conductive (doped), this results in an electrical short between floating gates. Thus, the shorted cells are defective. A block containing a significant number of such shorts may be a bad block and may be discarded. A die containing a significant number of such shorts may be considered a defective die.

While FIGS. 3 and 4 show two dies with two different examples of etch-related problems, it will be understood that a die may suffer from under-etching alone, from over-etching alone, or from a combination of under-etching and over-etching. Because the thickness of the gate dielectric layer may be very thin compared with the thickness of the stack being etched, stopping precisely at the gate dielectric layer without leaving some floating gate polysilicon residue at some locations and without etching the substrate at other locations may be difficult. Process variation across a silicon wafer, or across a die on a wafer, may produce over-etching at some locations and under-etching at other locations on the same wafer, or die.

Figure 5:
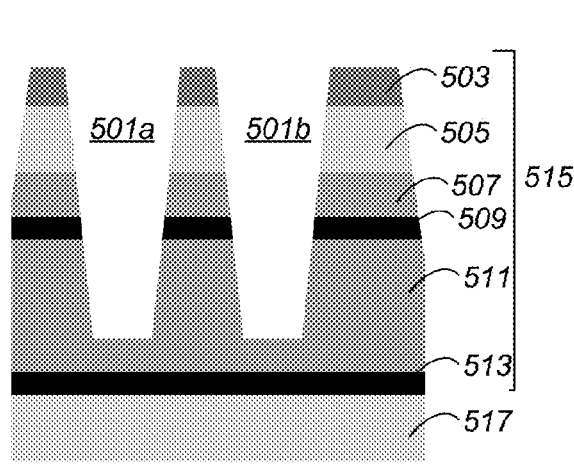
FIG. 5 illustrates an example of partial etching of a gate stack leaving some floating gate polysilicon under trenches.

FIG. 5 shows an example in which trenches 501a-b are etched partially through a stack of layers 515 formed on a substrate 517, stopping at an intermediate level that is above the bottom of the floating gate layer 511. Thus, instead of etching through the entire stack 515, etching stops with some floating gate polysilicon remaining under the trenches (i.e. between floating gates). Stack 515 in this example includes an etch mask (hard mask) layer 503, control gate metal (e.g. tungsten) 505, control gate polysilicon 507, inter-poly dielectric (IPD) 509, floating gate polysilicon 511, and gate dielectric 513. Etching trenches 501a-b may use anisotropic etching, for example Reactive Ion Etching (RIE) that may stop at an appropriate level based on time, or stopped using other factors (e.g. etch-stop, or end-point detection, as described in the examples provided later).

Figure 6:
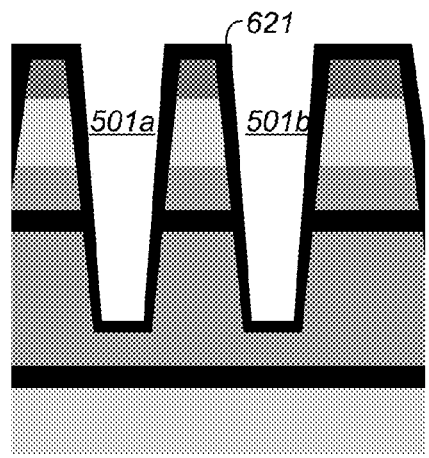
FIG. 6 illustrates an example of formation of a protective layer on the structure of FIG. 5.

FIG. 6 shows the structure of FIG. 5 after deposition of a protective layer 621 that overlies exposed surfaces including the side and bottom surfaces of trenches 501a-b. The protective layer may be any suitable dielectric material, for example, silicon oxide. Silicon nitride may also be used, either alone, or in combination with another dielectric. In some cases, a protective layer may be a compound layer formed of multiple individual layers. In other cases, a protective layer may be formed of just one material deposited in one deposition step. Atomic Layer Deposition (ALD), Chemical Vapor Deposition (CVD) or other suitable deposition technique may be used to deposit a thin protective layer along sides of high-aspect ratio trenches.

Figure 7:
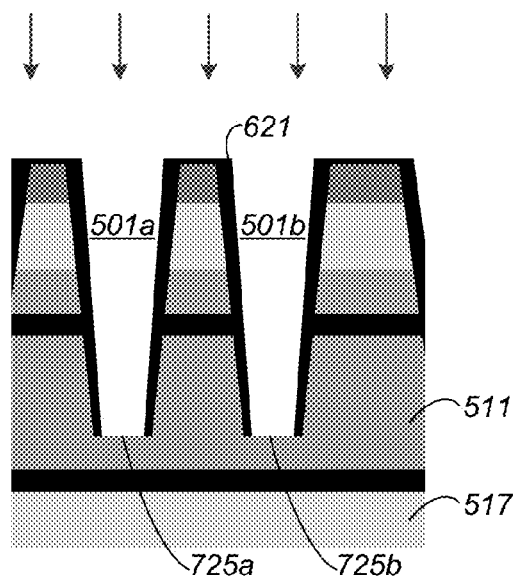
FIG. 7 illustrates an example of removal of the protective layer from bottoms of trenches.

FIG. 7 shows anisotropic etching of protective layer 621 that causes protective layer 621 to be etched through at bottoms of trenches 501a-b, thereby exposing floating gate poly 511 at locations 725a-b. It will be understood that anisotropic etching tends to remove protective layer 621 from locations 725a-b where it extends laterally and has a small vertical dimension while leaving protective layer 621 along sides of trenches 501a-b (forming sidewalls) where it extends vertically, or near-vertically, and has a larger vertical dimension.

FIG. 7 shows floating gate polysilicon 511 exposed at locations 725a-b under trenches 501a-b, while other surfaces are protected by protective layer 621. This allows a selective process to be directed at polysilicon 511 where it is exposed (locations 725a-b) without affecting structures that are protected by protective layer 621 (floating gates and control gates). With floating gates and control gates covered by protective layer 621, a selective process may complete separation of floating gates in a controlled manner.

Figure 8:
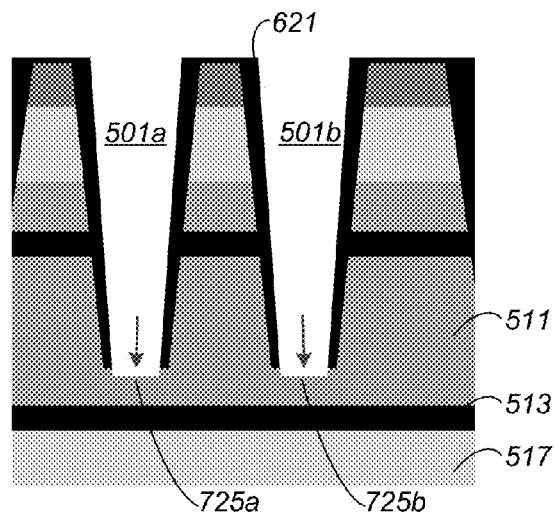
FIG. 8 illustrates an example of a selective process directed to exposed FG polysilicon.
Figure 9:
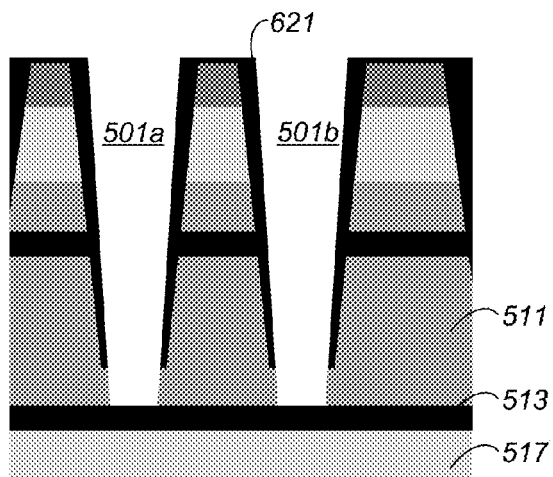
FIG. 9 illustrates an example of selective removal of exposed FG poly by selective etching.

FIG. 8 shows an example of a selective process that is directed to exposed areas 725a-b of floating gate polysilicon 511. In this example, a wet etch is used to selectively etch exposed polysilicon. The etch is selective to polysilicon, having a significantly higher etch rate for polysilicon than for protective layer 621. An example of a suitable wet etch may use fluonitric acid (e.g. an aqueous solution containing hydrofluoric acid (HF) fixed in alkaline solution such as potassium hydroxide (KOH), isopropyl alcohol (IPA) and water (H2O). Such a wet etch does not significantly affect protective layer 621. Furthermore, because it is selective to polysilicon, etching stops at gate dielectric layer 513 as shown in FIG. 9. Gate dielectric layer 513 may act as an etch stop layer for this step. All polysilicon may be removed under the trenches (no under-etching) without significant risk of damaging substrate 517 through over-etching.

Another example of a selective process may use Chemical Dry Etching (CDE) to extend trenches 501*a*-*b* down to gate dielectric 513. Because CDE does not use a plasma, the potential for gouging, or substrate damage, is reduced compared with RIE. Also, with protective layer 621 in place, the risk of damage to floating from CDE is small. gates or control gates. An example of a suitable CDE process is the "Frontier" process from Applied Materials.

Figure 10:
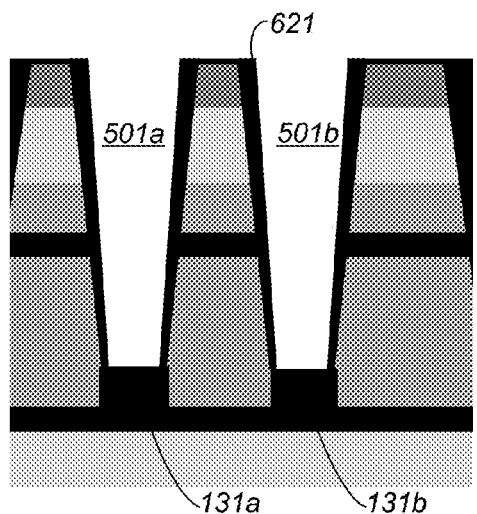
FIG. 10 illustrates an example of selective oxidation of exposed FG poly.

Another example of a selective process for separating neighboring floating gates uses selective oxidation of exposed polysilicon at locations 725*a*-*b* instead of etching. FIG. 10 shows an example in which such oxidation results in formation of portions of silicon oxide (e.g. silicon dioxide, $SiO_2$) 131*a*-*b* under trenches 501*a*-*b*. Thermal oxidation or chemical oxidation (or a combination) may be used to selectively oxidize exposed polysilicon instead of removing it. The thickness of protective layer 621 may be sufficient to ensure that little or no oxidation of protected structures (floating gates and control gates) occurs. Because silicon oxide is electrically non-conductive (dielectric) the consumption of polysilicon and formation of silicon oxide at these locations electrically separates neighboring floating gates from each other.

In some cases, it may be desirable to apply a selective process to a relatively small portion of polysilicon. Thus, it may be desirable to initially form trenches to a level close to the gate oxide so that the remaining thickness of polysilicon under trenches is small. For example, this may allow complete oxidation of polysilicon remaining under trenches without oxidation of other polysilicon (floating gates or control gates). It may allow a wet etch to be used without significant under-cutting of floating gates.

Figure 11A:
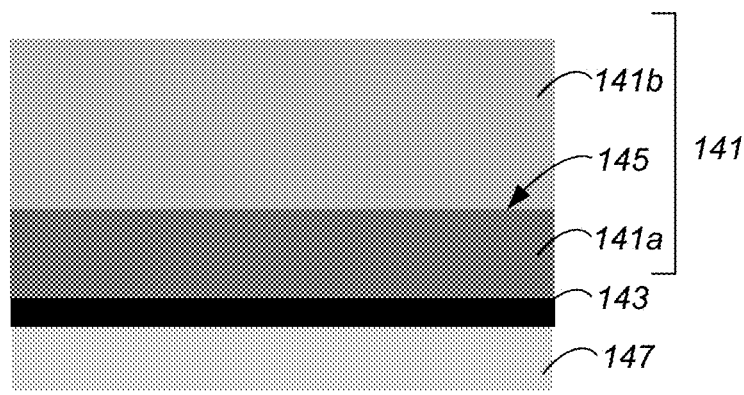
FIGS. 11A-C illustrate an example of steps to provide uniform trenches while leaving thin, uniform FG poly between trenches and gate dielectric.
Figure 11B:
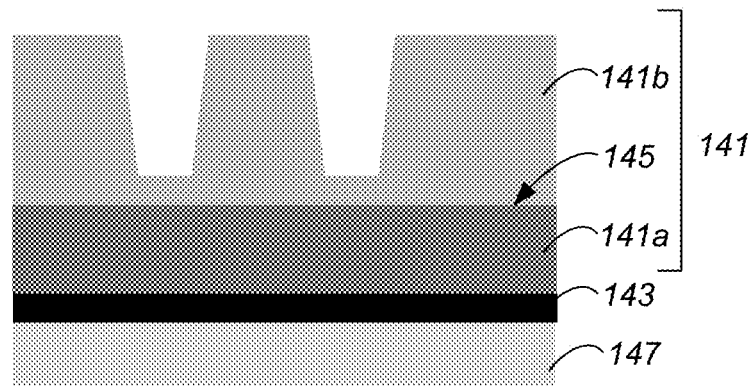
Figure 11C:
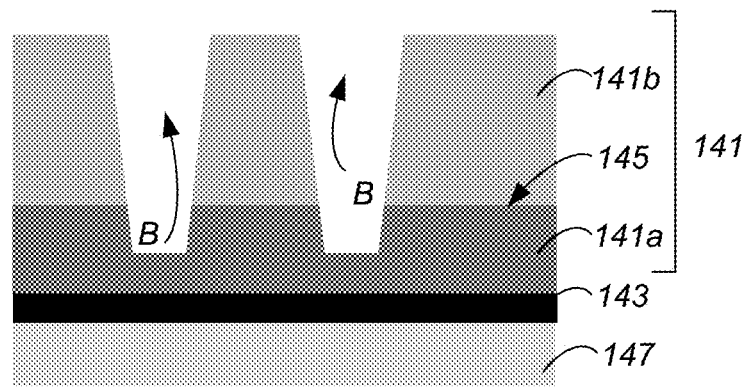

FIGS. 11A-C show an example of a structure and method for uniformly etching trenches down to a level that is close to a gate dielectric layer (while still leaving some polysilicon under trenches). FIG. 11A shows a floating gate polysilicon layer 141 that is a compound layer formed of two different polysilicon layers. A lower polysilicon layer 141*a* lies directly on the gate dielectric layer 143 and an upper polysilicon layer 141*b* lies directly on lower polysilicon layer 141*a*. Lower and upper polysilicon layers 141*a* and 141*b* may have different characteristics that facilitate etching to an intermediate level that is at, or near, an interface 145 between these layers (i.e. interface along a top surface of lower polysilicon layer 141*a* and bottom surface of upper polysilicon layer 141*b*). For example, lower polysilicon layer 141*a* may have a significantly lower etch rate than upper polysilicon layer 141*b* for a certain etch chemistry so that it can be used as an etch-stop layer. Lower polysilicon layer 141*a* may contain one or more materials that are not present in upper polysilicon layer 141*b* so that, when etched, the presence of such materials in an etch chamber may be used to indicated that etching has reached lower polysilicon layer 141*a* so that etching may terminate (end-point detection).

In one example, lower polysilicon layer 141*a* is heavily boron (B) doped polysilicon while upper polysilicon layer 141*b* is not heavily boron doped. In other examples, other dopants, such as carbon (C) may be used instead of, or in addition to boron. Upper polysilicon layer 141*b* may be undoped, or may be doped with a dopant other than boron or carbon, or with a much lower concentration of boron, carbon, or other dopant. Doping may be achieved in any suitable manner including CVD, and implantation. For example, floating gate polysilicon may be formed in a multi-step polysilicon CVD process including a first step that deposits in-situ boron-doped polysilicon and a second step that deposits undoped polysilicon.

FIG. 11B shows a first stage of anisotropic etching during which only upper polysilicon layer 141*b* is etched. Etching may use any suitable anisotropic etching scheme. The etching scheme may have a relatively high etch rate for material of upper polysilicon layer 141*b*.

FIG. 11C shows a second stage of anisotropic etching when trenches have reached interface 145 and etching of lower polysilicon layer 141*a* has started. Because lower polysilicon layer 141*a* is highly boron doped in this example, etch byproducts include boron (B). The presence of boron may be detected in the etch byproducts and may be used to determine when to end anisotropic etching so that some of lower polysilicon layer 141*a* remains under trenches (i.e. trenches do not expose gate dielectric 143. The anisotropic etching scheme may be chosen so that the etch rate of boron doped polysilicon of lower polysilicon layer 141*a* is lower than the etch rate for undoped/differently doped polysilicon of upper polysilicon layer 141*b*. Thus, lower polysilicon layer 141*a* may act as an etch-stop layer (either in addition to providing end-point information, or as an alternative to providing end-point information). As a result of end-point detection and/or etch-stopping provided by lower polysilicon layer 141*a*, trenches stop uniformly a short distance from gate dielectric layer 143 so that only a small portion of lower polysilicon layer 141*a* remains under trenches (see FIG. 5). Thus, a subsequent selective process may be directed to just a small portion of polysilicon. While the example of FIGS. 11A-C show a two-layer floating gate polysilicon structure, three or more layers may be used.

Figure 12:
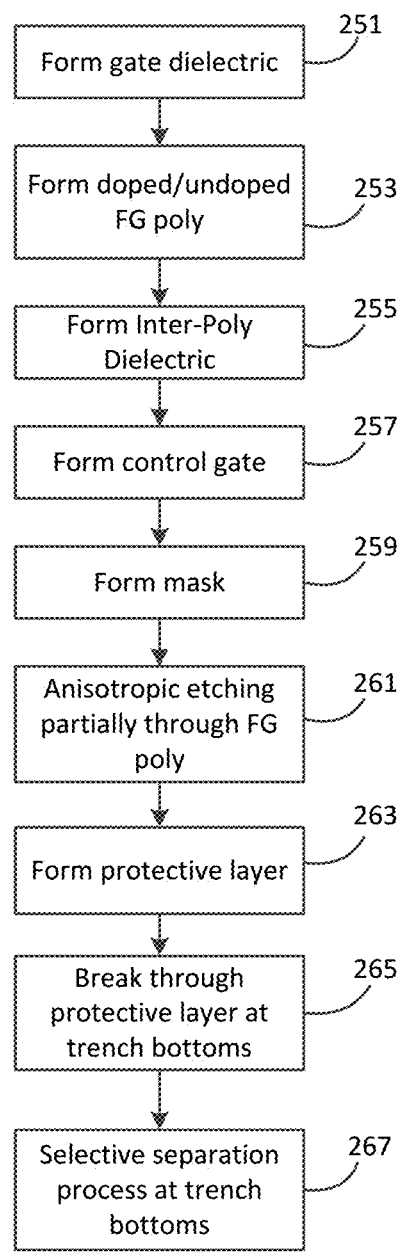
FIG. 12 illustrates an example of process steps used to separate floating gates uniformly.

An example of process steps that may be used in forming a NAND memory array are shown in FIG. 12. A gate dielectric layer is formed 251 across a surface of a silicon wafer. A layer of floating gate polysilicon is formed 253 directly on the gate dielectric layer. The floating gate polysilicon layer may include layers of polysilicon with different properties (e.g. doped and undoped) including different etching characteristics. Then, an inter-poly dielectric (IPD) layer is formed 255 over the floating gate polysilicon layer, and a control gate (word line) layer of polysilicon is formed 257 over the IPD layer. Additional layers such as a metal control gate layer may also be formed. Subsequently, a mask layer is formed 259, for example by depositing a hard mask material (e.g. silicon nitride) and patterning it to form a hard mask for etching. Subsequently, an anisotropic etching step 261 extends trenches through the stack, extending partially (not fully) through the floating gate polysilicon layer. A protective layer is then formed 263 along exposed surfaces including side and bottom surfaces of the trenches. The protective layer is then broken through 265 at the bottoms of trenches by anisotropic etching so that polysilicon of the floating gate polysilicon layer is exposed at trench bottoms. Subsequently, a selective separation process 267 is applied to separate floating gates by selectively eliminating conductive polysilicon from under trenches. This may be a selective etch, selective oxidation, or other selective process that removes or modifies polysilicon so that no material, or only electrically insulating (dielectric) material, remains between trenches and the gate dielectric layer.

CONCLUSION

Although the various aspects have been described with respect to particular examples, it will be understood that protection within the full scope of the appended claims is appropriate. Furthermore, although the present description teaches methods for implementation with respect to particular prior art structures, it will be understood that the present claims are entitled to protection when implemented in memory arrays with architectures other than those described.

It is claimed:

1. A method of forming a NAND flash memory comprising:
forming a gate dielectric layer directly on a substrate;
forming a floating gate polysilicon layer directly on the gate dielectric layer wherein forming the floating gate polysilicon layer comprises forming a doped polysilicon layer on the gate dielectric layer and subsequently forming an undoped polysilicon layer on an upper surface of the doped polysilicon layer;
forming additional layers over the floating gate polysilicon layer;
forming an etch mask over the additional layers;
performing anisotropic etching with the etch mask in place to etch trenches down to an intermediate level in the floating gate polysilicon layer, the trenches stopping while portions of the floating gate polysilicon remain between the trenches and the gate dielectric layer wherein the intermediate level is at or below the upper surface of the doped polysilicon layer and the anisotropic etching is stopped in response to detection of a level of dopant in etch byproducts that exceeds a predetermined limit during anisotropic etching;
subsequently forming a protective layer along exposed sides of the trenches; and
subsequently electrically separating individual floating gates by a selective oxidation process that oxidizes the remaining portions of the floating gate polysilicon layer exposed by trenches down to the gate dielectric layer.

2. The method of claim 1 wherein the anisotropic etching has a significantly higher etch rate for the undoped polysilicon than for the doped polysilicon so that the doped polysilicon layer acts as an etch stop layer.

3. The method of claim 1 wherein the protective layer is formed by depositing the protective layer along all exposed surfaces and subsequently removing the protective layer from bottoms of trenches to expose the remaining portions of the floating gate polysilicon layer.

4. The method of claim 1 wherein the selective oxidation process oxidizes the floating gate polysilicon under the trenches down to the gate dielectric and does not substantially oxidize the gate dielectric.

5. The method of claim 1 wherein the selective process is a Chemical Dry Etch (CDE) process.

6. A method of forming a NAND flash memory comprising:
forming a gate dielectric layer directly on a substrate;
forming a doped floating gate polysilicon layer directly on an upper surface of the gate dielectric layer;
forming an undoped floating gate polysilicon layer on an upper surface of the doped floating gate polysilicon layer;
forming additional layers over the undoped floating gate polysilicon layer;
forming an etch mask over the additional layers;
performing anisotropic etching with the etch mask in place to etch trenches down through the undoped floating gate polysilicon layer,
stopping the anisotropic etching at or below the upper surface of the doped floating gate polysilicon layer in response to end-point detection of dopant as an etch byproduct while portions of the doped floating gate polysilicon remain between the trenches and the gate dielectric layer;
subsequently forming a protective layer along exposed sides of the trenches; and
subsequently selectively removing the portions of the doped floating gate polysilicon down to the gate dielectric layer, thereby electrically separating floating gates, using an etch that etches doped polysilicon at substantially faster rate than the gate dielectric layer or the protective layer.

7. The method of claim 6 wherein the protective layer and the gate dielectric layer are formed of silicon oxide.

8. The method of claim 6 wherein the portions of the doped floating gate polysilicon are selectively removed by wet etching with an aqueous solution containing hydrofluoric acid (HF) fixed in alkaline solution that contains potassium hydroxide (KOH).

9. The method of claim 6 wherein the portions of the doped floating gate polysilicon are selectively removed by Chemical Dry Etching (CDE).

10. The method of claim 6 wherein the doped floating gate polysilicon layer is doped with boron (B) or carbon (C).

* * * * *